(12) United States Patent
Köstler et al.

(10) Patent No.: US 6,767,170 B2
(45) Date of Patent: Jul. 27, 2004

(54) WAFER HANDLING SYSTEM AND WAFER HANDLING METHOD

(75) Inventors: Wolfram Köstler, Langebrück (DE); Günther Hraschan, Dresden (DE)

(73) Assignee: Infineon Technologies SC300 GmbH & Co. KG, Dresden (DE)

(*) Notice: Subject to any disclaimer, the term of this patent is extended or adjusted under 35 U.S.C. 154(b) by 67 days.

(21) Appl. No.: 10/186,970

(22) Filed: Jul. 1, 2002

(65) Prior Publication Data

US 2003/0002973 A1 Jan. 2, 2003

(30) Foreign Application Priority Data

Jun. 29, 2001 (EP) ............................................. 01115947

(51) Int. Cl.$^7$ ............................................. B65G 47/24
(52) U.S. Cl. ...................... 414/217; 414/936; 414/939; 414/941
(58) Field of Search .................................. 414/217, 936, 414/939, 941, 433, 777, 222.07, 226.04, 222.01, 779, 783

(56) References Cited

U.S. PATENT DOCUMENTS

| | | | |
|---|---|---|---|
| 4,525,852 A | * 7/1985 | Rosenberg ..................... 378/34 |
| 4,582,191 A | * 4/1986 | Weigand ..................... 198/339.1 |
| 5,060,354 A | 10/1991 | Chizinsky |
| 5,352,249 A | * 10/1994 | Vollaro ....................... 29/25.01 |
| 5,405,518 A | 4/1995 | Hsieh et al. |
| 5,479,108 A | * 12/1995 | Cheng .......................... 324/765 |
| 5,695,568 A | 12/1997 | Sinha et al. |
| 5,703,493 A | 12/1997 | Weeks et al. |
| 5,783,834 A | * 7/1998 | Shatas .................... 250/559.33 |
| 5,810,935 A | * 9/1998 | Lee et al. .................... 118/728 |
| 5,842,825 A | * 12/1998 | Brooks ........................ 414/754 |
| 5,903,428 A | * 5/1999 | Grimard et al. ............. 361/234 |
| 5,974,682 A | * 11/1999 | Akimoto ......................... 34/66 |
| 6,002,840 A | * 12/1999 | Hofmeister .................. 700/245 |
| 6,007,635 A | 12/1999 | Mahawili |
| 6,047,480 A | * 4/2000 | Powers .......................... 33/645 |
| 6,139,251 A | * 10/2000 | Chu ............................ 414/783 |
| 6,151,447 A | 11/2000 | Moore et al. |
| 6,164,894 A | * 12/2000 | Cheng ..................... 414/416.03 |
| 6,167,893 B1 | * 1/2001 | Taatjes et al. ............... 134/147 |
| 6,183,189 B1 | * 2/2001 | Lzu et al. .................... 414/754 |
| 6,217,663 B1 | 4/2001 | Inokuchi et al. |
| 6,317,647 B1 | * 11/2001 | Akaike et al. ............... 700/213 |
| 6,318,947 B1 | * 11/2001 | Hahn et al. .................. 414/401 |
| 6,425,280 B1 | * 7/2002 | Ames et al. ................. 73/1.79 |
| 6,478,532 B1 | * 11/2002 | Coady et al. ............... 414/783 |
| 6,537,143 B1 | * 3/2003 | Yang et al. .................. 451/388 |
| 6,601,313 B2 | * 8/2003 | Shin et al. ..................... 33/645 |

\* cited by examiner

*Primary Examiner*—Douglas Hess
(74) *Attorney, Agent, or Firm*—Laurence A. Greenberg; Werner H. Stemer; Gregory L. Mayback (57) ABSTRACT

A wafer holder has a set of minimum contact wafer support members predefining support member contacting portions on a planar wafer surface of a wafer. The wafer chuck has a wafer support region for contacting the planar wafer surface. The wafer support region of the chuck includes recesses configured at predefined positions corresponding to support member contacting portions of the lower wafer surface. The wafer handling system further includes a wafer transport device including a rotational position adjusting device for adjusting the rotational position of a wafer that is transported between the wafer holder and the wafer chuck. Thereby, elevations on the lower wafer surface, like scratches or deposited material which are produced by the contact between the support members and the wafer, are encapsulated by the recesses of the wafer chuck. A method for moving a wafer between a wafer holder and a wafer chuck is also provided.

18 Claims, 4 Drawing Sheets

WAFER HANDLING SYSTEM AND WAFER HANDLING METHOD

BACKGROUND OF THE INVENTION

FIELD OF THE INVENTION

The present invention relates to a wafer handling system including a wafer holder and a wafer chuck. The wafer holder has a set of minimum contact wafer support members predefining support member contacting portions on a planar wafer surface of a wafer. The wafer chuck has a wafer support region for supporting the wafer. The wafer support region is constructed for contacting the planar wafer surface. The wafer holder and the wafer chuck have a relative position to each other which includes a distance extending in a horizontal direction.

The invention further refers to a wafer handling method for moving a wafer between a wafer holder and a wafer chuck.

In semiconductor product manufacturing, semiconductor wafers are processed in order to form integrated circuits thereon. A single wafer is subjected to about a few hundred processing steps that are performed in several processing tools.

Wafer processing requires the wafer to be positioned very precisely during some process steps that define an integrated circuit structure. Especially during lithographic exposure, it is very important that the wafer is very precisely positioned in a lithography tool to achieve sufficient alignment with integrated structures already existing on the wafer.

Wafer positioning includes correctly laterally adjusting the wafer position. This is commonly accomplished by steppers used for multiple exposure in lithography tools.

Furthermore, precise wafer positioning requires the wafer position in the direction perpendicular to the planar wafer surface to be sufficiently controlled. As each wafer is exposed to exposure light from this direction during a lithography step, the distance between the wafer and the exposure beam source, or if the wafer is oriented horizontally during exposure, the vertical position of the wafer, has a great influence on focus control. Any deviation of the vertical position of the upper wafer surface, which is being exposed, from the required position leads to defocusing and as a consequence, to the production of lithographic structures of minor quality. Wafers exposed in such a way often are rejected because of a bad critical dimension or misalignment with existing integrated structures.

Due to progressing miniaturization and integration, the exposure wavelength and as a consequence, the depth of focus achievable with the respective wavelength has decreased. Current lithography tools generate exposure light of a wavelength of 248 or 193 nm in the UV-range. Operating in this sub-$\mu$-range requires the wafer to be highly precisely positioned in the direction perpendicular to the plane of the wafer surface.

In a lithography tool, a wafer chuck supports the backside of the wafer from below and thereby adjusts the height of the upper-wafer surface that will be exposed. The wafer chuck has a wafer support region for receiving the wafer and is constructed for contacting the lower planar wafer surface. The cross section of the wafer support region is substantially equal to the circumference of the planar wafer surface of the wafers that will be supported.

When a wafer is resting on the wafer chuck, the height of the wafer in general is predefined by the height of the chuck or its wafer support region, respectively. However, often the back surface of the wafer has microscopic protrusions or elevations unintentionally produced during preceding processing steps. There may be various processing steps leading to such irregularities. Predominantly hot diffusion and deposition processes performed in high temperature furnaces cause these elevations.

There are at least two effects producing elevations on the contacted lower surface of a wafer in a high temperature furnace.

First, the speed of deposition of substances that will be deposited onto a wafer that is accessible from both sides is increased in the direct vicinity of the support member contacting portions of the backside of the wafer. Adjacent to these support member contacting portions of the wafer and support members supporting the wafer at these contacting portions, process gas flow is inhibited by the presence of a finger-like quartz support member, for instance. This may lead to an increased deposition rate near the contact area.

Second, the thermal expansion of the silicon wafers themselves relative to the quartz fingers may lead to the production of scratches from the lateral movement of the quartz finger tips relative to the lower wafer surface. Current hot diffusion processes require temperatures of 1000° C. and above, thereby producing a comparatively large movement due to thermal expansion. Furthermore, current 300 mm-wafers are rather heavy and because of their weight produce a high pressure onto the quartz finger tips. When the position of a wafer is displaced relative to a quartz finger due to thermal expansion, the movement of the quartz finger relative to the lower wafer surface produces scratches surrounded by elevating walls on both sides of the scratches. The weight of a 300 mm-wafer leads to the quartz finger tip providing a relatively high pressure onto the lower wafer surface, and as a consequence, to deeper scratches and higher adjacent elevating walls.

These irregularities deteriorate the planarity of the back surface of the wafer, and when the wafer is resting on the wafer chuck, lead to misalignments of the wafer position in the direction perpendicular to the wafer surface. As a consequence, defocusing is caused during lithographic exposure.

Whereas overall deviations from the height of a wafer supported by a wafer chuck may be corrected by appropriate wafer chuck positioning, local misalignments of the wafer position cannot be corrected in this way.

Due to the elasticity of the wafer material (like silicon or another metal) a wafer having microscopic elevations on its lower wafer surface is resting slightly deformed on the wafer chuck. In those surface regions covered with microscopic elevations and in their vicinity, the upper surface of the wafer is slightly elevated compared to surrounding portions of the upper wafer surface.

Hence the elevations on the lower wafer surface are locally lifting the wafer from the wafer chuck, whereas remote from these elevations the wafer surface is slightly concavely deformed and resting on the wafer chuck in direct contact to the wafer support region of the chuck.

Thereby local regions of defocussing, so-called focus spots, are caused at the lateral position of the backside elevations when a wafer is exposed to exposure light. In the area of the focus spots, the upper wafer surface is located out of the depth of focus. Thereby wafer surface is wasted because some semiconductor products produced will be rejected.

There are various attempts to overcome this problem by cleaning the wafer backside. However, all of these cleaning methods do not successfully remove the elevations from the back surface of the wafers.

It has been recognized that sometimes the focus spot vanishes after rotating the wafer on the wafer chuck. In the case of a vacuum chuck, for example, a ring chuck or a pin chuck, the wafer support region of the chuck has a multitude of pins or concentric rings forming the contact area for contacting the backside of a wafer. If a wafer is resting on such a vacuum chuck and an elevation is located on one of the pins or rings, the focus spot appears. In the case that the elevation is located just between adjacent pins or rings, the focus spot vanishes.

However, according to this method there is only an accidental chance of overcoming the problem of local wafer lifting in this way and additional efforts for surveying the appearance of focus spots are required.

SUMMARY OF THE INVENTION

It is accordingly an object of the invention to provide a wafer handling system and a method for moving a wafer between a wafer holder and a wafer chuck which overcomes the abovementioned disadvantages of the prior art apparatus and methods of this general type.

In particular, it is an object of the invention to reliably avoid the appearance of focus spots when a wafer resting on a wafer chuck is exposed to lithographic exposure light.

With the foregoing and other objects in view there is provided, in accordance with the invention, a wafer handling system, including: a wafer holder; a wafer chuck; a wafer transport device for transporting a wafer between the wafer holder and the wafer chuck; and a rotational position adjusting device. The wafer holder has a set of minimum contact wafer support members that predefine support member contacting portions on the planar wafer surface of the wafer. The wafer chuck has a wafer support region for supporting the wafer. The wafer support region is constructed for contacting the planar wafer surface of the wafer. The wafer holder and the wafer chuck are separated by a horizontal distance. The wafer chuck is formed with recesses configured at predefined positions corresponding to the support member contacting portions of the planar wafer surface. The rotational position adjusting device is for adjusting a rotational position of the wafer, which is being transported, such that the support member contacting portions of the planar wafer surface are located on the recesses of the wafer chuck when the planar wafer surface is contacted by the wafer support region of the wafer chuck.

According to the invention, a wafer transport device is provided with a device for controlling and/or adjusting the rotational orientation of a wafer that is being transported between the wafer holder and the wafer chuck. Thereby, the support member contacting portions on the planar wafer backside surface of the wafer are positioned exactly on the recesses in the wafer chuck. Thereby, when the wafer is resting on the wafer chuck, elevations on the wafer backside cannot result in the lithographic exposure of the wafer being of a poor quality.

According to the invention, the wafer handling system includes a wafer transport device for transporting a wafer from the set of support members to the wafer chuck. The transport device locates the wafer on the wafer chuck in a position and/or in an orientation such that the support member contacting portions of the wafer that are predefined by the support members are located on the recesses of the wafer chuck. The wafer transport device transfers the wafer from the support members to the chuck and thereby properly positions the wafer on the chuck. The support member contacting portions of the wafer are positioned within the recesses of the wafer chuck.

According to the invention, the wafer transport system further includes a rotational position adjusting device for adjusting the rotational position of a wafer before it is located on the wafer chuck. As in most cases, the rotational position of the wafer is changed when the wafer is being transferred from the quartz boat to the wafer chuck, and the wafer is rotated correspondingly for fitting the position of the wafer contacting portions to the position of the recesses. Hence a wafer rotating device is provided for rotating the wafer such that the positions of its support member contacting portions correspond to the positions of the recesses of the wafer chuck.

The present invention exploits the fact that those portions of the wafer backside where elevations or protrusions might occur often are located at the same lateral positions and at the same distances from each other. This regularity of lateral elevation positions is caused by the manner that the wafer is contacted before being transferred to the chuck.

In a high temperature furnace for instance, one or more lots of wafers are supported, by a quartz boat. Wafers and predominantly 300 mm wafers are supported in a horizontal position when they are resting on the quartz boat in a furnace.

Typically several dozens of wafers are supported by one single quartz boat, and each wafer is supported by three finger-like wafer support members that form part of the quartz boat. These support members are constructed such that they have a minimum dot-like contact area to the wafer when supporting the wafer. The positions of the three fingers with respect to each other are fixed so that the positions of the dot-like contact areas with respect to each other are fixed for all wafers too.

As current wafer handling is very precise, the positions of the support member contacting portions on the backside of wafers may be identified. Furthermore, as these support member contacting portions are rather small compared to the cross-section of the backside wafer surface, it is possible to adapt the shape of the wafer support region of the wafer chuck to the positions and the dimensions of the elevations that probably exist on the wafer backside. Accordingly safe protection from focus spots on wafers resting on a wafer chuck during lithographic exposure is achieved.

Preferably, the wafer chuck includes three recesses in the wafer support region. The recesses are configured symmetrically around the center of the wafer support region. As this is the minimum number of contact points for supporting a wafer during preceding wafer processing, it is advantageous to provide the equal number of recesses on the chuck. The recesses are sufficiently large in the lateral dimension to safely surround any elevations in the predefined areas on the wafer backside.

Preferably, the recesses are configured symmetrically around the center of the wafer support region, and as a consequence, around the center of the wafer backside. This enables safe focus spot protection even in the case that the wafer is rotated by 120° or 240° around the axis perpendicular to the center of the wafer plane when the wafer is resting on the wafer chuck. In this case the distance of each recess from the center of the wafer support region is equal.

Preferably, the recesses have a circular cross-section in the wafer support region. A circular cross-section is easy to produce by merely drilling a hole into the wafer chuck surface.

Preferably the diameter of the recesses is 5 to 15 mm. This contour of the recesses is large enough to safely surround any elevations adjacent to the wafer contacting regions and to encapsulate them from below so that the wafer backside completely contacts the wafer support region of the chuck. Any elevations on the wafer backside are surrounded by recesses.

Often three support members are used for supporting wafers during wafer processing in a furnace. These three wafer support members often produce six elevations or protrusions. Two elevations or protrusions are adjacent to one respective contact area of the wafer backside and one support member. In a furnace, semiconductor wafers are subjected to thermal expansion. This may lead to wafer plane deformation bending the wafer plane to some extent, thereby producing pairs of elevations azimuthally adjacent to the actual wafer contacting portions.

Two alternative embodiments are disclosed to safely surround these pairs of elevations.

According to a first embodiment, the recesses may have an elliptical cross-section in the wafer support region. Preferably, the recesses are configured such that the larger extension of the elliptical cross-section is oriented towards the interconnection between two adjacent elevations, whereas the smaller extension of the elliptical cross-section extends in the radial direction.

According to a second embodiment, the wafer chuck may include three pairs of recesses. Both recesses of each respective pair is configured adjacent to each other and the three pairs of recesses are configured symmetrically around the center of the wafer support region. In this embodiment, a very high planarity of the wafer when supported by the chuck is achieved due to the minimum cross-section of the recesses.

In contrast to the lateral extension of wafer backside elevations like scratches that are rather extended compared to microelectronic structures, the height of such elevations on the wafer backside is rather small. As a consequence the recesses may be rather shallow for sufficient protection from lifting the wafer from the chuck. Preferably the depth of the recesses is between 10 and 100 $\mu$m from the wafer support region. However, any larger depth of the recesses may also be realized. Accordingly, the recesses may be either hollow caves or cut-outs extending over the complete depth of the wafer support region of the chuck.

Wafer chucks provide a wafer support region that is designed as a planar support surface of an essentially circular cross-section. Especially when the wafer chuck is an electrostatic chuck, the full area within the wafer support region is a contact surface that contacts the wafer backside when a wafer is resting on the chuck.

However, there are other designs of wafer support regions constructed for contacting a planar wafer surface. If the wafer chuck is a vacuum chuck, the wafer that is supported by the chuck is exposed to vacuum suction from the wafer backside in order to safely control the wafer position on the wafer support region of the wafer chuck. By providing vacuum suction, highly precise positioning of the wafer in the direction perpendicular to the wafer plane is achieved.

In order to exert suction onto the wafer backside, the wafer support region of the wafer chuck is designed as a pattern of either pins or concentric rings. The pins or rings form segments of contact surfaces for contacting the wafer backside that rests on the wafer support region. Between these segments, ditches or conduits are provided for applying vacuum suction on the wafer backside.

According to the invention, the recesses for encapsulating elevations are superimposed on the wafer support regions. In preferred embodiments of the vacuum chuck, the chuck is a pin chuck or a ring chuck, and the three recesses are cut-outs in the pattern of pins or rings.

Preferably the wafer holder of the wafer handling system forms part of a quartz boat for a high temperature furnace. Current quartz boats have three quartz fingers extending radially below each wafer that will be supported in the furnace. Three protruding finger-like tips of the quartz boat define wafer contacting portions when the wafer is resting on the three fingers. Each of the three quartz fingers are configured in a fixed position with respect to each other. The wafer contacting portions are configured at fixed distances from each other for all of the wafers in the quartz boat. As a consequence, each wafer may be supported by the same wafer chuck with a single set of recesses configured in the wafer support region of the wafer chuck.

With the foregoing and other objects in view there is provided, in accordance with the invention, a wafer handling method for moving a wafer between a wafer holder and a wafer chuck. The method includes steps of: providing the wafer holder with a set of minimum contact wafer support members predefining support member contacting portions on a planar wafer surface of the wafer; providing the wafer chuck with a wafer support region for supporting the wafer; constructing the wafer support region for contacting the planar wafer surface; forming recesses in the wafer support region at predefined positions corresponding to the support member contacting portions of the planar wafer surface; lifting the wafer from the wafer holder; removing the wafer from a space above the wafer holder and transporting the wafer in a horizontal direction to the wafer chuck; and placing the wafer onto the wafer chuck such that the support member contacting portions of the planar wafer surface are located on the recesses of the wafer chuck when the planar wafer surface is contacted by the wafer support region.

When a semiconductor wafer is processed by a processing tool and is supported by the wafer holder during wafer processing, the wafer support members of the wafer holder are configured such that they predefine support member contacting portions on the backside of the wafer. As the distance between these support member contacting portions are fixed due to the fixed locations of the wafer support members, the locations of the contact surfaces between the wafer support members of the wafer holder and the wafer backside correspond to the configuration of the recesses of the wafer chuck. The positions of the wafer support members predefine the location of the support member contacting portions of the wafer backside. The support member contacting portions predefine the positions of the recesses in the wafer support region of the wafer chuck. Thereby, a 1:1-correspondence between a wafer holder construction and a wafer chuck construction is achieved.

Preferably, first the rotational position of the wafer is adjusted by the rotational position adjusting device and the wafer is descended onto the wafer chuck thereafter. In particular, the rotational position of the wafer is adjusted while the wafer is being transported to a space above the wafer chuck—i.e. during the horizontal transport of the wafer.

Preferably, the rotational orientation of the wafer is maintained while the wafer is being transported between wafer holder and the wafer chuck. Alternatively the rotational orientation of each wafer can be varied by a fixed angle. The rotational adjustment can depend on the rotational orientation of the respective set of minimum contact wafer support members.

Finally, preferably the wafer holder and the wafer chuck are oriented such that a wafer can be placed on the set of minimum contact wafer support members and on the wafer support region from the top side. The wafer holder and the wafer chuck are in a position relative to each other such that the wafer must be horizontally transported when moving the wafer between the wafer holder and the wafer chuck.

Other features which are considered as characteristic for the invention are set forth in the appended claims.

Although the invention is illustrated and described herein as embodied in a wafer handling system and wafer handling method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 1:
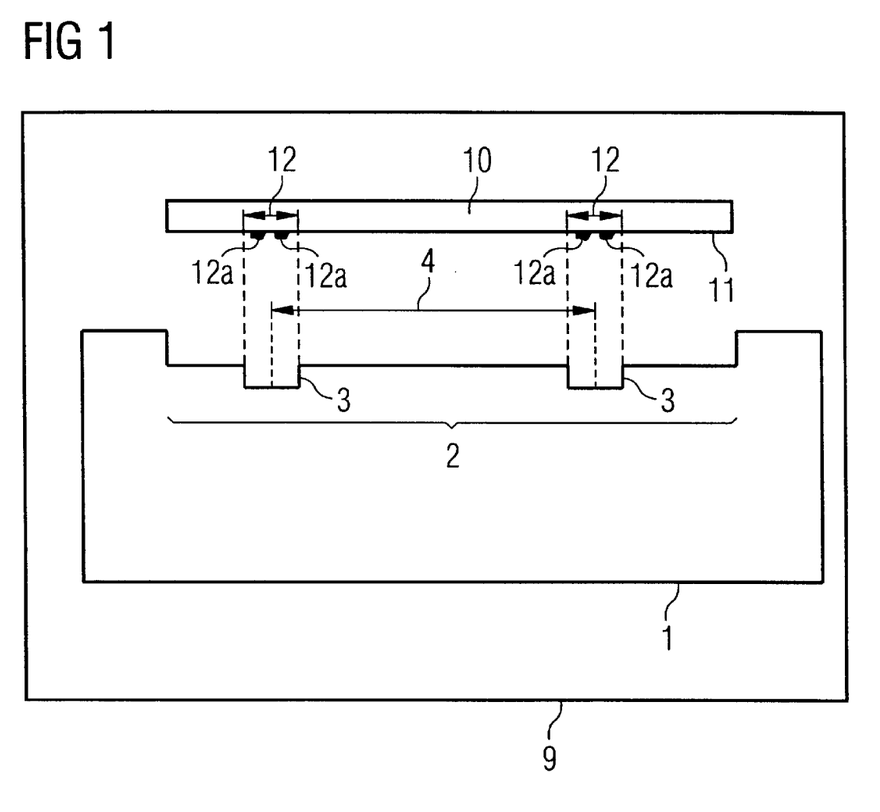
FIG. 1 shows a wafer chuck and a wafer disposed in a lithography device.

DESCRIPTION OF THE PREFERRED EMBODIMENTS:

Referring now to the figures of the drawing in detail and first, particularly, to FIG. 1 thereof, there is shown a wafer chuck 1 in a lithography device 9. A wafer 10 will be supported by the wafer chuck 1. The wafer chuck 1 provides a wafer support region 2. The cross-section of the wafer support region 2 corresponds to the circumference of the planar surface 11 of the wafer 10. FIG. 1 shows a cross-sectional view of the wafer chuck 1 and the wafer 10. This view is taken through the symmetry axis of the wafer extending perpendicular to the wafer plane in the center of the circular semiconductor wafer 10. In the wafer support region 2 of the wafer chuck 1 two recesses 3 are illustrated. To support a semiconductor wafer, at least three recesses 3 are required (the number of three recesses being the optimum number of contact points). As the cross-sectional view in FIG. 1 is intersecting the wafer chuck 1 and the wafer 10 symmetrically, only a single recess 3 is configured in the drawing plane. However, the illustration of two recesses 3 has been presented for better representing the invention in two dimensions.

The recesses 3 are configured at predefined positions 4 in the wafer support region 2. The predefined positions 4 correspond to support member contacting portions 12 of the wafer surface 11. When the wafer 10 is in the proper rotational position on the wafer chuck 1, the support member contacting portions 12 of the wafer back surface 11 are probably covered with elevations 12a and the recesses 3 of the wafer chuck 1 are configured at the same lateral positions 4 in the wafer support region 2 of the wafer chuck 1.

Figure 2A:
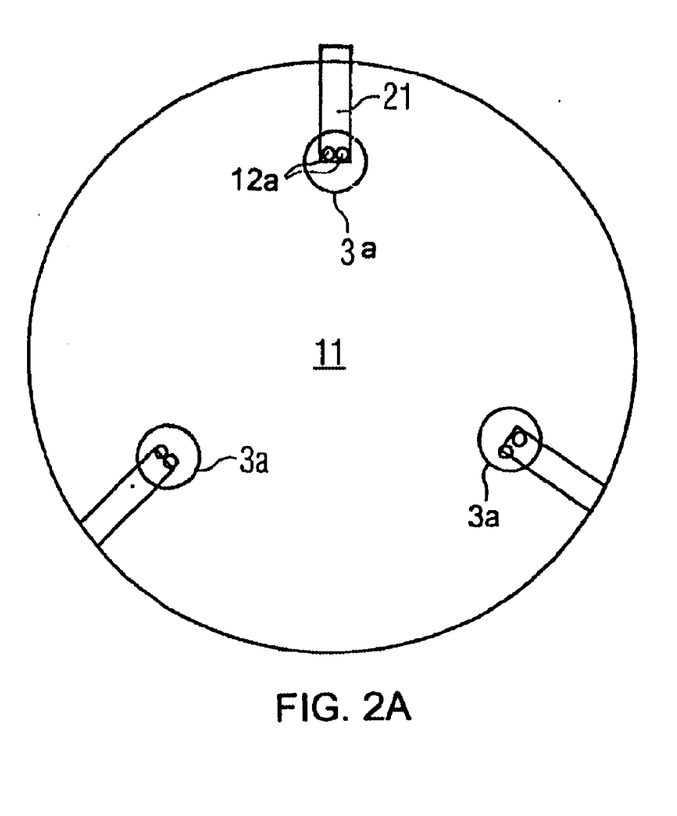
FIGS. 2A and 2B schematically show the position of support members that contact support member contacting portions of a wafer surface and also show recesses of an inventive wafer chuck.
Figure 2B:
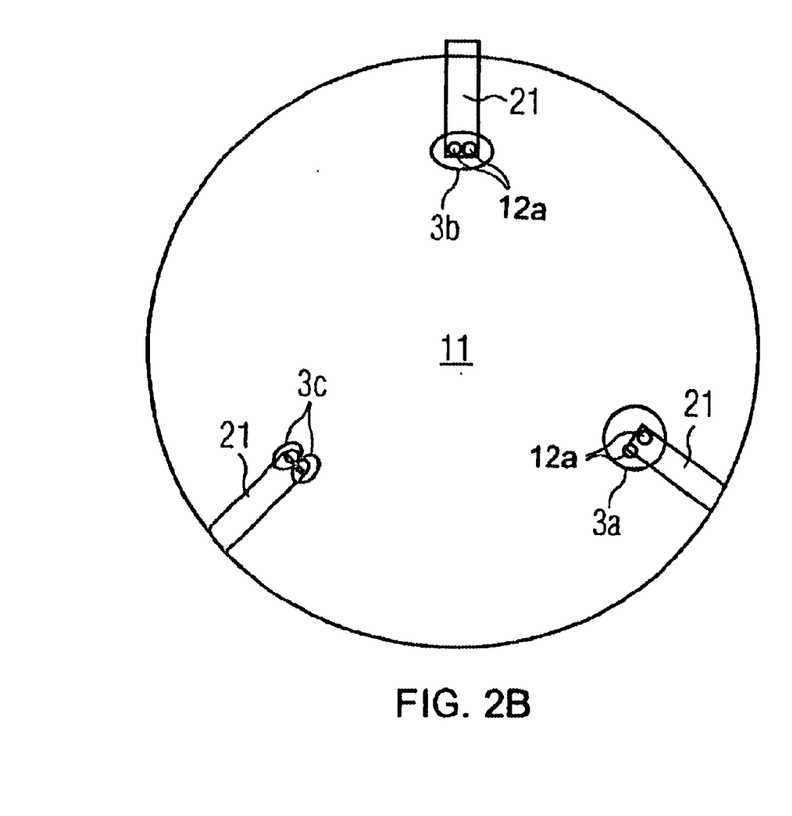

FIGS. 2A and 2B show a combined schematic view of the positions of support members 21, of a wafer surface 11 having support member contacting portions with elevations 12a, and of recesses 3a or 3b of an inventive wafer chuck 1.

In FIG. 2A, a circular planar wafer plane 11 is illustrated. Three portions of the wafer plane 11 are eventually covered with elevations 12a (like scratches or deposited material) that lift the wafer from a wafer chuck. These elevations 12a are caused by support members like quartz fingers 21 of a quartz boat 20 that contact the lower side of the wafers at predetermined support member contacting positions 12. As the elevations 12a have a rather small lateral dimension, the chuck is adapted to encapsulate these elevations 12a. Therefore three circular recesses 3 are provided surrounding the elevations 12a. Thereby the wafer is prevented from lifting, and the wafer is now completely contacted by the wafer support region 2 (See FIG. 1) of the wafer chuck 1.

Whereas in FIG. 2A, an embodiment with three circular recesses 3a is illustrated, other embodiments are shown in FIG. 2B. Often the wafer surface is bent in a high temperature furnace due to a different amount of thermal expansion in different regions of the wafer plane. As a consequence, often each quartz finger produces pairs of elevations 12a. According to a first embodiment, the wafer chuck includes three pairs of elliptical recesses 3b (only one being shown in the figure), each recess surrounding one pair of elevations 12a.

Alternatively, three pairs of recesses 3c (only one being shown in the figure) are provided in the chuck, each recess surrounding one respective elevation 12a.

In the case of a vacuum chuck, the chuck may be designed as a pin chuck or as a ring chuck. In these cases, the wafer support region 2 is designed as a pattern of pins in a concentric ring.

Figure 3:
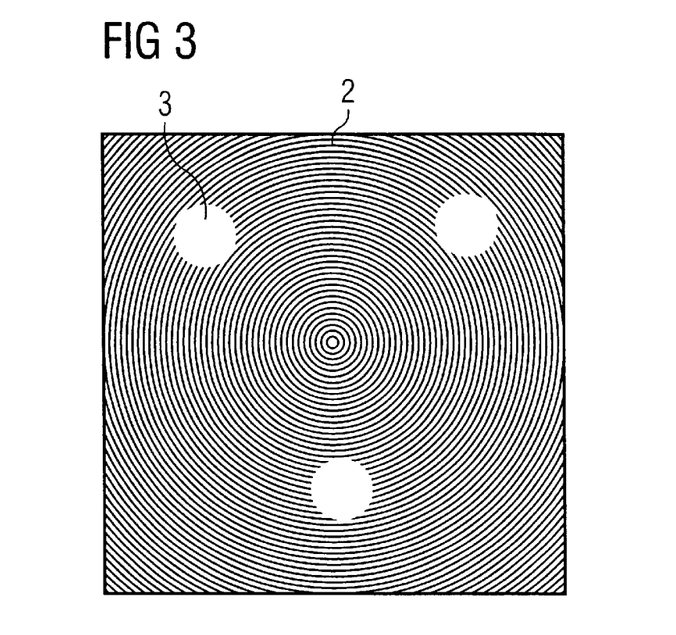
FIG. 3 is a schematic view of an embodiment of an inventive wafer chuck.

According to the present invention, three recesses are superimposed on the respective pattern of the wafer contacting region 2. FIG. 3 illustrates a part of the wafer contacting region 2 of a ring chuck, the multitude of rings of the pattern forming the contact area for contacting the backside of a wafer by the wafer contacting region 2. The pattern of concentric rings around the center of the wafer contacting region 2 is recessed by three recesses 3 of a diameter larger than the ring-to-ring distance.

When a wafer is resting on such a ring chuck 3, sometimes the focus spot caused by the elevations 12a vanishes after a rotating the wafer 10 on the wafer chuck 1. This depends on whether an elevation 12a is resting on a ring of the ring pattern or in the space between two adjacent rings. If an elevation 12a of the wafer backside is located at one of the rings, the focus spot appears. When the elevation 12a is located just between adjacent rings, the focus spot vanishes. Without any inventive recesses 3, there is only an accidental chance of overcoming the problem of local wafer lifting that is caused by the elevations 12a on the backside of the wafer, whereas according to the invention the recesses 3 safely surround and encapsulate such elevations.

Figure 4:
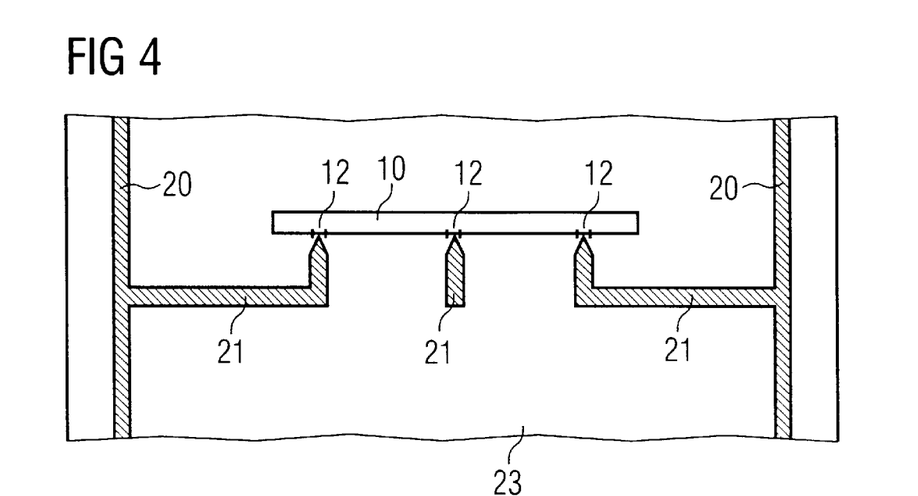
FIG. 4 shows a wafer on a set of wafer support members of a quartz boat located in a high temperature furnace.

FIG. 4 illustrates a quartz boat 20 supporting a wafer 10 in a high temperature furnace 23. The quartz boat 20 supports several dozens of wafers 10. Each wafer 10 is supported by three support members, which can be finger-like quartz fingers 21. As the tips of the quartz fingers 21 are in fixed positions relative to each other, they predefine contact areas 12 of the contacted wafer 10. As all wafers positioned in a quartz boat are contacted by a respective set of support members or fingers, the three quartz fingers of each set are provided at the same distance from each other and in the same rotational position relative to the location and to the orientation of the wafer. The support members predefine support member contacting portions 12 on the backside of the wafers. The position of the support member contacting portions 12 on the wafer back surface is identical for all of the wafers.

For this reason it is possible to encapsulate the scratches and other elevations on the back surface of the wafers by using recesses 3 of a chuck 1. The recesses 3 are at the same positions of the wafer surface plane as the elevations. Therefore elevations need no longer be removed from the backside of the wafer to properly position the wafer on the wafer chuck.

Figure 5:
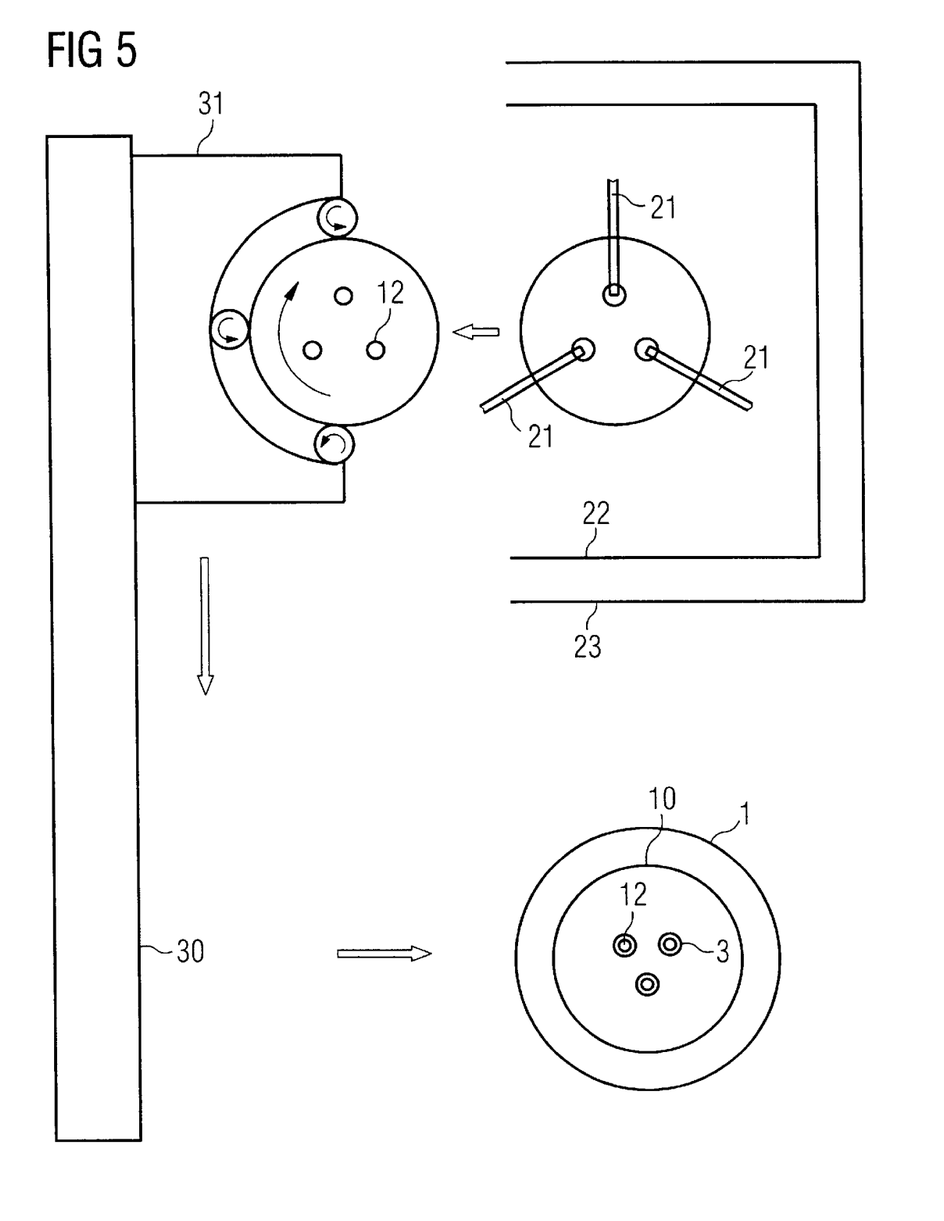
FIG. 5 shows an inventive wafer handling system and a wafer handling method.

FIG. 5 shows a wafer handling system including a wafer chuck 1, and a wafer holder 20 having a set three of minimum contact wafer support members 21. The wafer support members predefine support member contacting portions 12 on the planar wafer surface. A wafer transport device 30 is provided for transporting the wafer from the wafer holder 20 (which may be a quartz boat in a high, for instance) to the wafer chuck 1. The transport device 30 locates the wafer on the wafer chuck 1 in a position and/or in an orientation such that the support member contacting portions 12 of the wafer 10 predefined by the support members 21 are located on the recesses 3 of the wafer chuck 1. The wafer transport device 30 includes a rotational position adjusting device 31 for adjusting the rotational position of a wafer 10 transported before the wafer is located on the wafer chuck 1.

We claim:

1. A wafer handling system, comprising:
   a wafer holder;
   a wafer chuck;
   a wafer transport device for transporting a wafer between said wafer holder and said wafer chuck; and
   a rotational position adjusting device;
   said wafer holder having a set of minimum contact wafer support members predefining support member contacting portions on a planar wafer surface of the wafer;
   said wafer chuck having a wafer support region for supporting the wafer, said wafer support region being constructed for contacting the planar wafer surface of the wafer;
   said wafer holder and said wafer chuck being separated by a horizontal distance;
   said wafer chuck formed with recesses configured at predefined positions corresponding to the support member contacting portions of the planar wafer surface; and
   said rotational position adjusting device being for adjusting a rotational position of the wafer, which is being transported, such that the support member contacting portions of the planar wafer surface are located on said recesses of said wafer chuck when the planar wafer surface is contacted by said wafer support region of said wafer chuck.

2. The wafer handling system according to claim 1, wherein:
   said wafer support region has a center; and
   said recesses of said wafer chuck are configured symmetrically around said center of said wafer support region.

3. The wafer handling system according to claim 1, wherein said recesses have a circular cross-section and are formed in said wafer support region.

4. The wafer handling system according to claim 1, wherein:
   each of said recesses have a diameter in a range from 5 to 15 mm.

5. The wafer handling system according to claim 1, wherein:
   said recesses are formed in said wafer support region and have an elliptical cross-section.

6. The wafer handling system according to claim 1, wherein:
   said wafer support region has a center;
   said recesses define three pairs of recesses symmetrically configured around said center of said wafer support region; and
   each one of said three pairs of said recesses includes two recesses located near each other.

7. The wafer handling system according to claim 1, wherein:
   each of said recesses has a depth between 10 and 100 $\mu$m in said wafer support region.

8. The wafer handling system according to claim 1, wherein:
   said wafer chuck is a vacuum chuck.

9. The wafer handling system according to claim 1, wherein:
   said vacuum chuck is a pin chuck.

10. The wafer handling system according to claim 1, wherein:
    said vacuum chuck is a ring chuck.

11. The wafer handling system according to claim 1, wherein:
    said rotational position adjusting device forms part of said wafer transport device.

12. The wafer handling system according to claim 1, comprising:
    a quartz boat for a high temperature furnace;
    said wafer holder forming a part of said quartz boat.

13. The wafer handling system according to claim 1, comprising:
    a lithography device;
    said wafer chuck forming part of said lithography device.

14. A wafer handling method for moving a wafer between a wafer holder and a wafer chuck, the method which comprises:
    providing the wafer holder with a set of minimum contact wafer support members predefining support member contacting portions on a planar wafer surface of the wafer;
    providing the wafer chuck with a wafer support region for supporting the wafer;
    constructing the wafer support region for contacting the planar wafer surface;
    forming recesses in the wafer support region at predefined positions corresponding to the support member contacting portions of the planar wafer surface;
    lifting the wafer from the wafer holder;
    removing the wafer from a space above the wafer holder and transporting the wafer in a horizontal direction to the wafer chuck; and
    placing the wafer onto the wafer chuck such that the support member contacting portions of the planar wafer surface are located on the recesses of the wafer chuck when the planar wafer surface is contacted by the wafer support region.

15. The wafer handling method according to claim 14, which comprises:

using a rotational position adjusting device to adjust a rotational position of the wafer, and then descending the wafer onto the wafer chuck.

16. The wafer handling method according to claim 14, wherein:

the step of transporting the wafer to the wafer chuck includes adjusting a rotational position of the wafer while transporting the wafer to a space above the wafer chuck.

17. The wafer handling method according to claim 14, which comprises:

maintaining a rotational orientation of the wafer while performing the step of transporting the wafer to the wafer chuck.

18. The wafer handling method according to claim 14, which comprises:

orienting the wafer holder and the wafer chuck such that the wafer can be placed on the set of minimum contact wafer support members and on the wafer support region from above; and orienting the wafer holder and the wafer chuck such that the wafer must be horizontally moved between the wafer holder and the wafer chuck.

\* \* \* \* \*